United States Patent [19]

Rao

[11] Patent Number: 4,874,716

[45] Date of Patent: Oct. 17, 1989

[54] PROCESS FOR FABRICATING INTEGRATED CIRCUIT STRUCTURE WITH EXTREMELY SMOOTH POLYSILICONE DIELECTRIC INTERFACE

[75] Inventor: Kalipatnam V. Rao, Plano, Tex.

[73] Assignee: Texas Instrument Incorporated, Dallas, Tex.

[21] Appl. No.: 146,936

[22] Filed: Jan. 22, 1988

Related U.S. Application Data

[62] Division of Ser. No. 846,683, Apr. 1, 1986, abandoned.

[51] Int. Cl.$^4$ .......................................... H01L 21/263
[52] U.S. Cl. ........................................ 437/43; 437/46; 437/48; 437/49; 437/52; 437/47; 437/60; 437/101; 437/193; 437/228; 437/919; 357/235
[58] Field of Search ...................... 437/49, 51, 52, 47, 437/60, 189, 193; 357/23.5, 54, 599, 2

[56] References Cited

U.S. PATENT DOCUMENTS

| | | | |
|---|---|---|---|
| 3,673,471 | 6/1972 | Klein et al. | 357/42 |
| 4,062,747 | 12/1977 | Chang et al. | 204/164 |
| 4,267,558 | 5/1981 | Gutermano | 357/23.5 |
| 4,282,540 | 8/1981 | Ning et al. | 357/23.5 |
| 4,441,249 | 4/1984 | Alspector et al. | 437/47 |
| 4,446,194 | 5/1984 | Candelaria | 357/54 |
| 4,455,568 | 6/1984 | Shiota | 357/54 |
| 4,479,831 | 10/1984 | Sandow et al. | 357/596 |
| 4,603,059 | 7/1986 | Kiyosumi et al. | 427/95 |

FOREIGN PATENT DOCUMENTS 2131407 6/1984 United Kingdom .

OTHER PUBLICATIONS

Herbeke et al., "LPCUD Polycrystalline Silicon; Growth and Physical Properties of In-Situ Phosphorus Doped and Undoped Films", RCA review, vol. 44, pp. 287–312, Jun. 83.

*Primary Examiner*—Brian E. Hearn
*Assistant Examiner*—Tom Thomas
*Attorney, Agent, or Firm*—William E. Hiller; N. Rhys Merrett; Melvin Sharp

[57] ABSTRACT

A process for obtaining extremely smooth interfaces of poly 1/inter-level dielectric film/poly 2 films. Essentially, the poly 1 layer is LPCVD-deposited in the amorphous phase and implant-doped, after which an appropriate dielectric film is deposited by LPCVD. Following this, the poly 1 is crystallized at a temperature of about 1000° C., after which poly 2 is LPCVD-deposited and POCl$_3$-doped at 950° C. The resulting poly 2/inter-level dielectric/poly 1 interfaces are extremely smooth on an atomic scale, even after other device fabrication thermal cycles, and are believed to resutl in superior leakage characteristics.

17 Claims, 4 Drawing Sheets

PROCESS FOR FABRICATING INTEGRATED CIRCUIT STRUCTURE WITH EXTREMELY SMOOTH POLYSILICONE DIELECTRIC INTERFACE

This is a division of application Ser. No. 846,683, filed Apr. 1, 1986, now abandoned.

BACKGROUND AND SUMMARY OF THE INVENTION

The present invention relates to integrated circuits and to methods for manufacturing them.

VLSI non-volatile memories and other high-voltage integrated circuits usually use two layers of polysilicon, with an appropriate dielectric film in between the two poly layers, to sustain high electric fields with requirements of very low leakage currents. Conventionally, polysilicon films are deposited by LPCVD at about 620° C. The dielectric film can be a thermally grown oxide on the poly 1 layer, or it could be a composite film of oxide/nitride/oxide.

In many kinds of integrated circuit structures, and particularly in non-volatile memories such as EPROMs and EEPROMs, the smoothness of the polysilicon to dielectric interface of poly-to-poly capacitors is critical. That is, normally when an oxide is grown on polysilicon, the polysilicon to dielectric interface will be found to have significant asperities. As is well known, these asperities lead to electric field enhancements, and therefore, to prevent breakdown, the dielectric thickness must be made much larger than would be necessary if the interface were perfectly smooth and flat. Prior art studies have attempted to find answers to the problem of providing a smooth polysilicon to dielectric interface, but without noticeable success. Published literature on research activities relating to this area of art includes the following, articles of which are hereby incorporated by reference Harbeke et al., *LPCVD Polycrystalline Silicon: Growth and Physical Properties of In-Situ Phosphorus Doped and Undoped Films*, 44 RCA REVIEW 287 (June 1983).

Chiao et al., *Developments in Thin Polyoxides for Non-Volatile Memories*, SEMICONDUCTOR INTERNATIONAL, April 1985, Pages 156–159.

Faraone et al., *Characterization of Thermally Oxidized n+ Polycrystalline Silicon*, 32 IEEE Transactions on Electron Devices—(March 1985).

The Faraone et al paper in the March 1985 IEEE Transactions on Electron Devices suggests depositing the lower polysilicon layer as an amorphous layer rather than as a polycrystalline layer as a means of improving the interface smoothness with an insulating layer of silicon oxide subsequently provided on the polysilicon layer by thermal oxidation. In the latter respect lowering the temperature at which polysilicon is deposited from (e.g.) 620 degrees °C. down to (e.g.) 560 degrees °C., will cause the as-deposited polysilicon film to be amorphous, rather than polycrystalline. This amorphous film will initially have a significantly flatter surface than a polycrystalline film, simply because the grain boundaries and orientation differences of the grains in a polycrystalline film tend to produce some initial surface roughness.

However, a crucial teaching of the present invention, is that, after an amorphous first silicon layer has been deposited, it should be oxidized, but instead a deposited dielectric should be used. The reason for this is that the oxidation process degrades the surface topography for reasons which are not merely thermal. The oxidation process appears to include enhanced diffusion of oxygen along the grain boundaries, and this grain-boundary diffusion itself produces roughness. Thus, chemical vapor deposition of good quality dielectrics will typically proceed at temperatures only slightly lower than those which would be used in a fairly low temperature oxidation step, but the resulting interface smoothness is very much improved, since the effects of oxygen transport along grain boundaries are substantially avoided. Thus, the present invention provides a very much smoother interface than was possible in any prior art method.

Moreover, it should be noted that the discussions of smoother interface in the prior art do not provide a fully manufacturable process, as does the present invention. That is, the prior art processes appear to require very delicate control over the temperatures used in low-temperature oxidation steps, and this tight control degrades manufacturability. Thus, another advantage of the present invention is improved manufacturability.

Moreover, a further teaching of the present invention is that the silicon layer should not be diffusion doped (e.g. using $POCl_3$), but should be doped by implantation. The implantation process further amorphizes the deposited silicon layer, and thus further contributes to maintaining a small grain size in this layer after the relatively high temperature dielectric deposition step.

It should be noted that, either using the oxidation processes of the prior art or the deposited dielectric processes of the present invention, some grain growth will occur during the high-temperature step. One surprising result of the present invention is that the deposited dielectric maintains an extremely smooth interface, even while this grain growth is occurring, to convert the amorphous as-deposited layer to a polycrystalline layer.

In one class of embodiments of the present invention, the deposited dielectric is configured as an oxide/nitride layered dielectric which is further thermally oxidized to form an oxide/nitride/oxide layered structure; this dielectric is particularly useful in holding the poly-1 interface in place during the thermal cycles.

It is also noted that the only known discussion of the relevance of ion implantation as opposed to diffusion doping occurs in the Faraone communication which is cited as reference 21 in the Faraone article.

This results in a capacitor (where the lower plate is polycrystalline and predominantly silicon) where the breakdown voltage for a given thickness of dielectric is improved, and therefore (to use a commonly accepted figure of merit) the charge stored per unit area on this capacitor can significantly be increased.

In particular, the present invention is especially advantageous in the context of EPROM cells. The coupling between the floating gate and control gate is always desired to be as close as possible, but the dielectric from polysilicon to polysilicon must not break down under the voltages used, and moreover this dielectric must have extremely low leakage currents, to maintain a good storage lifetime. The present invention, by reducing asperities at the polysilicon to dielectric interface, advantageously improves not only breakdown voltage, but also leakage currents at voltages less than breakdown.

Thus, an EPROM or EEPROM cell constructed according to the present invention has major advantages, and substantially improves over any available prior art structure in the respects of control gate to floating gate coupling and leakage current.

Thus, the present invention provides at least the following advantages, in addition to others mentioned in this application:

More reproducible manufacturing process
Reduced leakage current through inter-level capacitors
Higher breakdown voltage in inter-level capacitors
Inter-level capacitors with a given breakdown voltage can be given a higher specific capacitance
Floating gate memory transistors of a given density can be fabricated to program faster.

A process for fabricating a non-volatile memory cell, comprising the steps of: providing a semiconductor body; forming gate insulators over predetermined locations of nonvolatile memory transistors; depositing a first conductive layer comprising more than 50% atomic of silicon in an amorphous (not polycrystalline) condition over said predetermined locations of nonvolatile memory transistors; depositing a dielectric over said first layer; depositing a second conductor layer over said dielectric; and patterning said first and second conductor layers so that, in said predetermined locations of nonvolatile memory transistors, said first conductor layer forms a floating gate and said second conductor layer forms a control gate.

According to the present invention there is also provided: A process for fabricating a capacitor between two conductive layers in integrated circuit manufacture, comprising the steps of: depositing a first conductive layer comprising more than 50% atomic of silicon in an amorphous (and not polycrystalline) condition; depositing a dielectric over said first layer; and depositing a second conductor layer over said dielectric.

provides widely applicable inventive concepts, which can be embodied in a tremendous variety of specific contexts; the specific embodiments discussed are merely illustrative of specific ways to make and use the invention, and do not delimit the scope of the invention.

This invention describes a process for obtaining extremely smooth interfaces of poly 2/interlevel dielectric/poly 1, for VLSI applications requiring very thin dielectrics. The poly 1 film is deposited at 560° C. in the amorphous phase, and implant-doped with P31 at 50 keV with a dose of about $1.0E16\ cm^{-2}$. This is followed by LPCVD deposition (at 800° C.) of the inter-level dielectric; 330 Angstroms $SiO_2$ (bottom)/85 Å $Si_3N_4$ (top). The next step is an oxidation process (1000° C., steam, 60 minutes) to convert part of the nitride film into an oxynitride, to provide a triple-layer dielectric film. During this oxidation step, the underlying poly 1 film is simultaneously annealed to crystallize from the as-deposited amorphous phase, while still maintaining the smooth poly 1/deposited oxide interface. The thermal oxidation of part of the nitride film can also be done using a shorter time (about 30 minutes) at 1000° C. in steam, or alternatively by use of high-pressure oxidation (for example, 850° C. steam at 10 atmospheres pressure, for about 27 minutes), so as to minimize excessive lateral movement of dopant species (such as arsenic from buried diffusions) in the underlying silicon single-crystal.

Subsequent to the interlevel dielectric film preparation, a second polysilicon film (poly 2) is deposited at 620° C., and $POCl_3$-doped at 950° C. for about 20 minutes, deglazed with 10% HF (30 seconds), and the remaining device processes are then completed as usual.

The approach used in one sample embodiment of this invention is compared below with the approach described in the Faraone et al. paper in the March 1985 IEEE Transactions on Electron Devices referred to earlier:

| process step | TI Approach | Faraone et al Approach |
| --- | --- | --- |
| poly 1 deposition | 560° C., 3000 Å | 560° C., 7500 Å |
| poly 1 doping | P31 ion implant (50 keV. 1E16 $cm^{-2}$ | P31 ion implant (120 keV. 1E16 $cm^{-2}$ |
| thermal oxidation | — | 850° C., 750 Å |
| LPCVD oxide dep. | 800° C., 330 Å | — |
| LPCVD nitride dep. | 800° C., A5 Å | — |
| anneal | 1000° C. steam (30–60 minutes) (alternate: high-pressure steam oxidation. 850° C. 10 atm) | — |
| poly 2 dep. | 620° C., 4500 Å | 560° C. |
| poly 2 doping | $POCl_3$ 950 C. 20 min | $POCl_3$ 950° C. |

BRIEF DESCRIPTION OF THE DRAWINGS

The present invention will be described with reference to the accompanying drawings, wherein:

FIG. 3 is a micrograph of a sample structure fabricated using the present invention, and FIGS. 1 and 2 are micrographs of structures fabricated in accordance with other processes.

DESCRIPTION OF THE PREFERRED EMBODIMENTS

The making and use of the presently preferred embodiments will now be discussed in great detail. However, it should be appreciated that the present invention One key difference in the above two approaches is that the process in accordance with the present invention provides for the deposition of the interlevel dielectric by LPCVD methods on top of the amorphous n+ poly 1, and then for the annealing of the amorphous silicon layer at 1000° C. to crystallize it, whereas the Faraone et al process grows a thermal oxide dielectric on the amorphous n+ poly 1. The deposition of the inter-level dielectric films in the manner contemplated herein provides a process which is more manufacturable and reproducible than a process relying upon thermal oxidation to grow the dielectric such as described in the Faraone et al paper, since thermal oxidation to grow thin oxides is very difficult to control.

The process taught by the present invention is not only applicable to EPROMs and EEPROMs, but also to a wide range of other high-voltage integrated circuits, including controllers, analog parts, and others.

Figure 1:
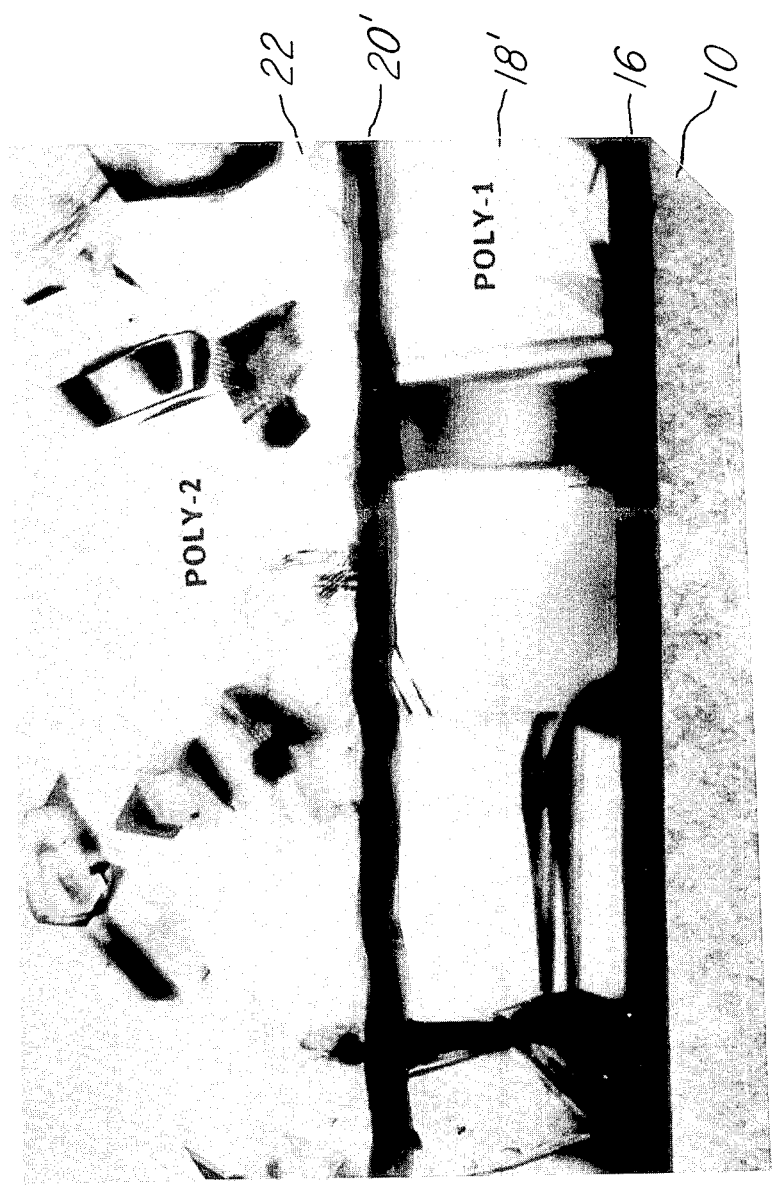
FIGS. 1–3 are micrographs.
Figure 2:
Figure 3:

The poly 2/interlevel dielectric/poly 1 interfaces produced by the present invention can be seen in the high-resolution cross-sectional transmission electron microscopy (TEM) reproduced in FIG. 3. For comparison, FIGS. 1 and 2 show the results of other processes. Essentially, these figures show clearly that the poly 2/interlevel dielectric/poly 1 interface provided by the present invention is extremely smooth, and much smoother than that provided by the prior art methods. As these micrographs show, the process described in the Faraone et al IEEE Electron Dev. paper produces an interface roughness (FIGS. 9, 10) which appears to be about 300–500 Å of interface roughness (at the poly-1/dielectric interface) for 620° C. polycrystalline silicon, whereas use of 560° C. amorphous silicon gives about 120–220 Å of interface roughness. By contrast, the micrograph of FIG. 3 shows that the interface is very smooth using the process in accordance with the present invention—the roughness factor as measured by a maximum local excursion in either direction normal to the interface being certainly less than 55 Å, and may be more like 10 Å.

Figure 4A:
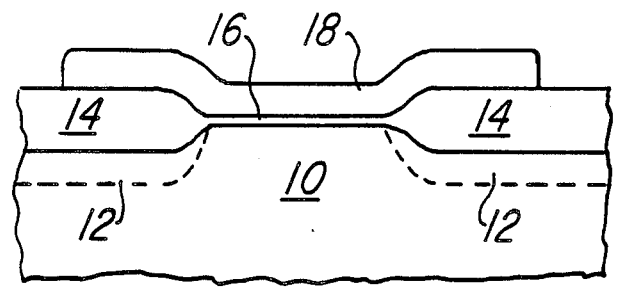
FIGS. 4A–4C are sequential cross-sectional views of a sample process for fabricating a non-volatile memory cell according to the present invention.
Figure 4B:
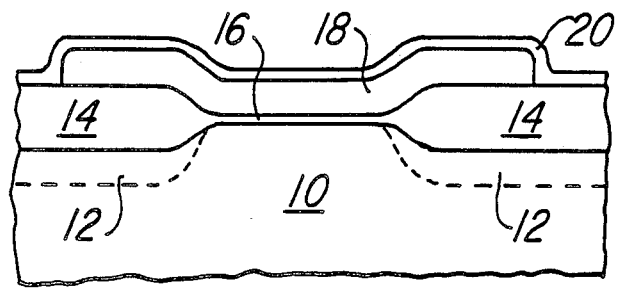
Figure 4C:
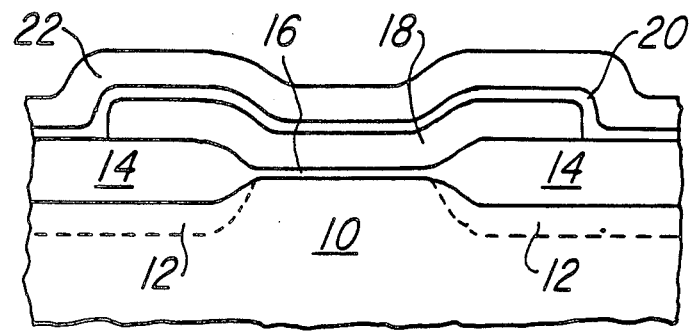

FIGS. 4A–4C show sample sequential processing steps in fabricating an EPROM cell according to the present invention. A substrate 10 (preferably a p on p+ epitaxial structure) has n+ bitline diffusions 12 which are overlaid by self-aligned thick oxide (SATO) regions 14. A thin oxide 16 is grown in the space between the bitline oxides 14, to provide the gate oxide of the FAMOS transistor. The silicon to form the "poly 1" level 18 is now deposited, but this layer is not (at this point) polycrystalline; it is amorphous. This layer is implanted to achieve the desired conductivity, and is then patterned and etched using conventional techniques, to yield the structure shown in FIG. 4A.

Next, a layered dielectric 20 is deposited overall, as shown in FIG. 4B. This dielectric 20 is preferably deposited as a multi-layer structure, and its top layer is preferably converted to a composite dielectric by a short high-temperature oxidation step. This results in an oxide/nitride/oxide sandwich structure as described above. However, a wide variety of other dielectric structures (single-layer or multi-layer, composite or of simpler composition) can be used, as long as the amorphous silicon layer 18 is not substantially oxidized. For an advanced EPROM cell, with a spacing of about a micron between the diffusions 12, the dielectric thickness used is preferably (as described above) about 400 Å equivalent oxide thickness; but of course other thicknesses (preferably smaller) could be used instead.

After the dielectric 20 is in place, the structure is preferably subjected to a high-temperature anneal, to permit the silicon layer 18 to crystallize and lower its resistivity. After this step, the layer 18 will be polycrystalline (although it was amorphous earlier). The dielectric 20 is now preferably stripped from the periphery, and the gate oxide for the peripheral devices grown. Deposition of the poly 2 layer 22 can now proceed; the poly 2 layer is preferably doped by diffusion, and is then patterned and etched (using a stack etch which sequentially etches poly 2, dielectric 20, poly 1 layer 18 (as is well known in the EPROM art). Processing then proceeds with other conventional steps—deposition of interlevel dielectric, contact etch, metal etch, protective overcoat deposition, etc.

Of course the poly 2 layer does not have to be strictly silicon, but can be a metal or a layered structure. Silicides and polysilicon/silicide sandwich structures are certainly comprehended, and future sandwich structures which have analogous deposition and electrical properties in future processes to the place of polysilicon in present processes are intended to be comprehended also. Moreover, the poly 1 layer can also include some admixture of other materials, as long as the layer is substantially amorphous when deposited and contains a large fraction of silicon.

Thus, the present invention provides the crucial advantage that the interface between layers 18 and 20, and between layers 20 and 22, is extremely smooth, and much smoother than was possible in the prior art, without introducing significant additional processing complexity.

As will be appreciated by those skilled in the art, the present invention can be widely modified and varied, and its scope is not limited except as specified in the allowed claims.

What is claimed is:

1. A process for fabricating an integrated circuit structure on a substrate, comprising:
   depositing a conductive layer of amorphous silicon on said substrate;
   depositing a dielectric layer on said conductive layer of amorphous silicon in such a manner as to define an interface between said dielectric layer and said conductive layer of amorphous silicon of extreme smoothness having a roughness factor measured by a maximum local excursion in either direction normal to said interface no greater than 60 angstroms; and
   crystallizing said conductive layer of amorphous silicon to form polycrystalline silicon as said conductive layer, while maintaining the smoothness of said interface between said dielectric layer and said conductive layer of polycrystalline silicon with a roughness factor measured by a maximum local excursion in either direction normal to said interface no greater than 60 angstroms.

2. A process as set forth in claim 1, wherein the dielectric layer is deposited on said conductive layer of amorphous silicon by low pressure chemical vapor deposition.

3. A process as set forth in claim 2, further including:
   implanting a dopant material in the conductive layer of amorphous silicon subsequent to the deposition thereof on said substrate.

4. A process as set forth in claim 3, wherein said conductive layer of amorphous silicon is deposited on said substrate in the amorphous phase at 560 degrees C.

5. A process for fabricating an integrated circuit structure on a substrate, comprising:
   depositing a first conductive layer of amorphous silicon on said substrate;
   depositing a dielectric layer on said first conductive layer of amorphous silicon in such a manner as to define a smooth first interface between said dielectric layer and said first conductive layer of amorphous silicon of extreme smoothness having a roughness factor measured by a maximum local excursion in either direction normal to said first interface no greater than 60 angstroms;
   crystallizing said first conductive layer of amorphous silicon to form polycrystalline silicon as said first conductive layer, while maintaining the smoothness of said first interface between said dielectric layer and said first conductive layer of polycrystalline silicon with a roughness factor measured by a maximum local excursion in either direction normal to said first interface no greater than 60 angstroms; and depositing a second conductive layer on said dielectric layer in such a manner as to define a smooth second interface between said dielectric layer and said second conductive layer.

6. A process as set forth in claim 5, wherein each of said first conductive layer of amorphous silicon, said dielectric layer, and said second conductive layer is respectively deposited by low pressure chemical vapor deposition.

7. A process as set forth in claim 6, further including: implanting a dopant material in the first conductive layer of amorphous silicon subsequent to the deposition thereof on said substrate.

8. A process as set forth in claim 7, wherein said first conductive layer of amorphous silicon is deposited on said substrate in the amorphous phase at 560 degrees C.

9. A process as set forth in claim 5, wherein the deposition of said dielectric layer on said first conductive layer of amorphous silicon comprises:
  depositing a multi-layer dielectric film including
    depositing by low pressure chemical vapor deposition a first dielectric film of silicon oxide,
    depositing by low pressure chemical vapor deposition a second dielectric film of silicon nitride on said first dielectric film of silicon oxide to define a dual-film dielectric,
    subjecting the dual-film dielectric to oxidation, and converting a portion of the silicon nitride film onto a silicon oxynitride film in response to the oxidation to define a triple-layer dielectric film.

10. A process as set forth in claim 9, wherein crystallizing of the first conductive layer of amorphous silicon to form polycrystalline silicon as the first conductive layer is accomplished by annealing the first conductive layer of amorphous silicon simultaneously with the oxidation of the dual-film dielectric in converting part of the silicon nitride film into a silicon oxynitride film.

11. A process as set forth in claim 9, wherein said multi-layer dielectric film is of the order of 400 angstroms in thickness.

12. A process for fabricating an integrated circuit structure on a substrate, wherein said substrate is of semiconductor material of one conductivity type; said process comprising:
  depositing dopant material of the other conductivity type in the semiconductor substrate in first and second regions thereof in spaced relation with respect to each other and to define first and second regions of the other conductivity type in said substrate with a space forming a channel therebetween;
  depositing an insulating layer on said semiconductor substrate in the space between said first and second regions of the other conductivity type and extending in overlying relation to the channel formed by the portion of the semiconductor substrate of one conductivity type between said first and second regions;
  depositing a first conductive layer of amorphous silicon on said insulating layer defining a floating gate overlying and capacitively coupled to the channel of said one conductivity type;
  depositing a dielectric layer on the first conductive layer of amorphous silicon in such a manner as to define a smooth first interface between said dielectric layer and said first conductive layer of amorphous silicon of extreme smoothness having a roughness factor measured by a maximum local excursion in either direction normal to said first interface no greater than 60 angstroms;
  crystallizing said first conductive layer of amorphous silicon to form polycrystalline silicon as said first conductive layer while maintaining the smoothness of said first interface between said dielectric layer and said first conductive layer of polycrystalline silicon with a roughness factor measured by a maximum local excursion in either direction normal to said first interface no greater than 60 angstroms; and
  depositing a second conductive layer on said dielectric layer in such a manner as to define a smooth second interface between said dielectric layer and said second conductive layer such that a non-volatile memory cell is produced in which the second conductive layer defines a control gate capacitively coupled to a floating gate as defined by said first conductive layer of polycrystalline silicon via said dielectric layer interposed therebetween.

13. A process as set forth in claim 12, wherein the deposition of said dielectric layer upon said first conductive layer of amorphous silicon is accomplished in such a manner as to provide said smooth first interface therebetween with a maximum local excursion in either direction normal to said first interface no greater than 10 percent of the thickness of said dielectric layer.

14. A process as set forth in claim 12, wherein each of said first conductive layer of amorphous silicon, said dielectric layer, and said second conductive layer is respectively deposited by low pressure chemical vapor deposition.

15. A process as set forth in claim 14, further including:
  implanting a dopant material in the first conductive layer of amorphous silicon subsequent to the deposition thereof on said insulating layer.

16. A process as set forth in claim 12, wherein the deposition of said dielectric layer on said first conductive layer of amorphous silicon comprises:
  depositing a multi-layer dielectric film including
    depositing by low pressure chemical vapor deposition a first dielectric film of silicon oxide,
    depositing by low pressure chemical vapor deposition a second dielectric film of silicon nitride on said first dielectric film of silicon oxide to define a dual-film dielectric,
    subjecting the dual-film dielectric to oxidation, and converting a portion of the silicon nitride film into a silicon oxynitride film in response to the oxidation to define a triple-layer dielectric film.

17. A process as set forth in claim 16, wherein crystallizing of the first conductive layer of amorphous silicon to form polycrystalline silicon as the first conductive layer is accomplished by annealing the first conductive layer of amorphous silicon simultaneously with the oxidation of the dual-film dielectric in converting part of the silicon nitride film into a silicon oxynitride film.

* * * * *

UNITED STATES PATENT AND TRADEMARK OFFICE
CERTIFICATE OF CORRECTION

PATENT NO. : 4,874,716

DATED : October 17, 1989

INVENTOR(S) : Kalipatnam V. Rao and James L. Paterson

It is certified that error appears in the above-identified patent and that said Letters Patent is hereby corrected as shown below:

On the title page of the patent as issued, the designation of the patentee in the upper left-hand portion as "Rao" should read --Rao et al--.

After the item identified as "[54]", in the title, "POLYSILICONE DIELECTRIC" should read --POLYSILICON-DIELECTRIC--.

After the item identified as "[75]", the designation "Inventor: Kalipatnam V. Rao, Plano, Tex." should read --Inventors: Kalipatnam V. Rao, Plano; James L. Paterson, Richardson, both of Tex.--.

Column 1, line 4, in the title, "POLYSILICONE DIELECTRIC" should read --POLYSILICON-DIELECTRIC--.

Signed and Sealed this

Sixteenth Day of June, 1992

Attest:

DOUGLAS B. COMER

Attesting Officer

Acting Commissioner of Patents and Trademarks